(12) United States Patent
Choi

(10) Patent No.: US 7,678,688 B2
(45) Date of Patent: Mar. 16, 2010

(54) METHOD FOR FORMING METAL INTERCONNECTION IN IMAGE SENSOR

(76) Inventor: Kyeong-Keun Choi, 1 Hyangjeong-dong, Heungbuk-gu, Cheongju-si, Chungcheongbuk-do 361-725 (KR)

( * ) Notice: Subject to any disclaimer, the term of this patent is extended or adjusted under 35 U.S.C. 154(b) by 286 days.

(21) Appl. No.: 11/641,788

(22) Filed: Dec. 20, 2006

(65) Prior Publication Data
US 2007/0155167 A1    Jul. 5, 2007

(30) Foreign Application Priority Data
Dec. 29, 2005    (KR) .................. 10-2005-0134203

(51) Int. Cl.
H01L 21/4763    (2006.01)

(52) U.S. Cl. .................. 438/629; 438/783; 438/660; 257/E21.489; 257/E21.497; 257/E21.482

(58) Field of Classification Search .................. 438/689, 438/660, 629, 783; 257/E21.489, E21.482, 257/E21.496, E21.497
See application file for complete search history.

(56) References Cited

U.S. PATENT DOCUMENTS

| | | | | |
|---|---|---|---|---|
| 6,077,764 A | 6/2000 | Sugiarto et al. | .............. | 438/597 |
| 6,140,224 A | 10/2000 | Lin | .............. | 438/634 |
| 6,294,832 B1 | 9/2001 | Yeh et al. | .............. | 438/751 |
| 6,723,634 B1 | 4/2004 | Ngo et al. | .............. | 438/627 |
| 2001/0019361 A1* | 9/2001 | Savoye | .............. | 348/222 |
| 2003/0045096 A1* | 3/2003 | Shioya et al. | .............. | 438/687 |
| 2006/0017164 A1* | 1/2006 | Tabuchi et al. | .............. | 257/751 |
| 2006/0226555 A1* | 10/2006 | Noguchi et al. | .............. | 257/774 |
| 2007/0108618 A1* | 5/2007 | Hasunuma et al. | .............. | 257/758 |
| 2008/0233761 A1* | 9/2008 | Ozawa et al. | .............. | 438/758 |

FOREIGN PATENT DOCUMENTS

| | | |
|---|---|---|
| JP | 08-055851 | 2/1996 |
| KR | 19-2000-0066128 A | 11/2000 |
| KR | 2002-0035620 | 5/2002 |
| KR | 10-2004-0065963 A | 7/2004 |
| KR | 2004-0108240 | 12/2004 |
| KR | 2005-0031302 | 4/2005 |
| KR | 2005-0070526 | 7/2005 |

* cited by examiner

*Primary Examiner*—Caridad M Everhart
(74) *Attorney, Agent, or Firm*—McAndrews, Held & Malloy, Ltd.

(57) ABSTRACT

A method for forming a metal interconnection in an image sensor includes forming a first interlayer dielectric (ILD) layer having a contact plug over a substrate, forming a diffusion barrier layer over the first ILD layer, performing a forming gas annealing, forming a second ILD layer over the diffusion barrier layer, etching the second ILD layer and the diffusion barrier layer to form a trench, forming a conductive layer to fill the trench, and planarizing the conductive layer to form a metal interconnection electrically connected to the contact plug.

15 Claims, 2 Drawing Sheets

METHOD FOR FORMING METAL INTERCONNECTION IN IMAGE SENSOR

CROSS-REFERENCE TO RELATED APPLICATIONS

The present invention claims priority of Korean patent application number 10-2005-0134203, filed on Dec. 29, 2005, which is incorporated by reference in its entirety.

BACKGROUND OF THE INVENTION

The present invention relates to a method for fabricating an image sensor, and more particularly, to a method for forming a metal interconnection in an image sensor.

An image sensor is a device for converting one or two- or higher-dimensional optical image into an electrical signal. The image sensor is mainly classified into a camera tube and a solid-state image sensor. The camera tube has been widely used in layer, control, recognition, etc, employing an image processing technology on the basis of a television, and its application technology has been developed. As the solid-state image sensor, which comes into a market currently, there are metal oxide semiconductor (MOS) image sensors and charge coupled devices (CCDs).

The CMOS image sensor converts an optical image into an electrical signal using a CMOS fabrication technology, and employs a switch mode to detect outputs one by one using MOS transistors which are made as many as the number of pixels. In particular, the CMOS image sensor has advantages in that a driving mode is simple, various scanning modes can be embodied, and a signal processing circuit can be integrated into a single chip, which can miniaturize a chip. In addition, the CMOS image sensor is inexpensive and consumes a low power, because of utilizing a compatible CMOS technique.

Recently, to reduce a noise, various attempts have been made to reduce an interlayer thickness between metal interconnections in fabricating an image sensor. One of them is to form a copper (Cu) interconnection using damascene process. The reason is that the copper has excellent interconnection characteristic in spite of relatively small thickness because it has a lower electrical conductivity than aluminum (Al).

In the method for fabricating the image sensor using the copper interconnection, an annealing process is additionally performed using a forming gas for reducing a dark current in a device after a padding process. Generally, the dark current characteristic can be reduced if the annealing process is performed at a high temperature of 400° C. or higher. This characteristic can be understood from Fick's diffusion equation as below.

$$C(x,t) = erfc(x/(4Dt)^{1/2})$$

$$D = D_0 * exp(-E_a/kT) \quad \text{[Diffusion Equation]}$$

where D, t, C, Ea denote diffusion coefficient, time, concentration, and activation energy, respectively.

However, it may be difficult to perform the annealing process at a high temperature of 450° C. or higher due to a thermal degradation of the copper interconnection.

SUMMARY OF THE INVENTION

Embodiments of the present invention are directed to provide a method for forming a metal interconnection in an image sensor, which can secure thermal stability of a metal interconnection and improve dark current characteristic.

In accordance with an aspect of the present invention, there is provided method for forming a metal interconnection in an image sensor, including: forming a first interlayer dielectric (ILD) layer having a contact plug over a substrate; forming a diffusion barrier layer over the first ILD layer; performing a forming gas annealing; forming a second ILD layer over the diffusion barrier layer; etching the second ILD layer and the diffusion barrier layer to form a trench; forming a conductive layer to fill the trench; and planarizing the conductive layer to form a metal interconnection electrically connected to the contact plug.

DESCRIPTION OF SPECIFIC EMBODIMENTS

Figure 1A:
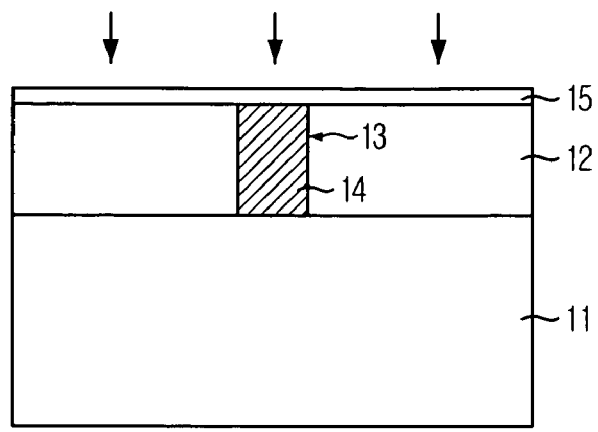
FIGS. 1A to 1D illustrate cross-sectional views of a method for forming a metal interconnection in an image sensor in accordance with a preferred embodiment of the present invention.

FIGS. 1A to 1D illustrate cross-sectional views of a method for forming a metal interconnection in an image sensor in accordance with a preferred embodiment of the present invention. Referring to FIG. 1A, a first interlayer dielectric (ILD) layer 12 is formed on a substrate 11. Herein, although not shown, the substrate 11 includes a device isolation structure and a transistor.

The first ILD layer 12 is selectively etched to form a contact hole 13. Although not shown, a photoresist layer is formed on the first ILD layer 12 and is exposed and developed to form a photoresist pattern exposing a predetermined region where the contact hole 13 will be formed. After forming the contact hole 13 by etching the first ILD using the photoresist pattern as an etch mask, the photoresist pattern is removed using oxygen plasma.

A conductive material is formed to fill the contact hole 13, and thereafter the conductive material is planarized using the first ILD layer 12 as a target, thereby forming a contact plug 14. Here, the contact plug 14 may be formed of tungsten with a Ti/TiN bilayer stacked.

A first diffusion barrier layer 15 is formed on the resultant structure. Herein, the first diffusion barrier layer 15 may be formed of SiC or SiN. Afterwards, a forming gas annealing is performed in a mixture gas ambient of $H_2$ and $N_2$ under a condition that a ratio of $H_2/N_2$ is in the range of approximately 3% to approximately 30%. The annealing process is performed at a high temperature ranging from approximately 400° C. to approximately 600° C. for approximately 10 minutes to approximately 3 hours.

Such a pad annealing process can maximize metal-insulator-metal (MIM) capacitor reliability and device reliability by eliminating side effects in advance which may occur in a subsequent process of the MIM capacitor.

Figure 1B:
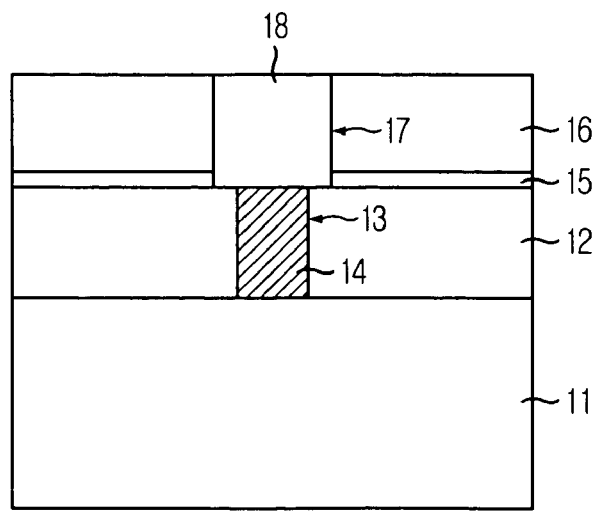

Referring to FIG. 1B, a second ILD layer 16 is formed on the first diffusion barrier layer 15. The second ILD layer 16 is formed of fluorinated silicate glass (FSG) containing nitrogen. In case of using the FSG containing nitrogen, it is possible to improve the dark current characteristic in virtue of high hydrogen concentration because of N—H contained in the FSG thin film. Other dielectric materials, such as a CVD SiOC low-k dielectric material and a spin on dielectric (SOD) low-k dielectric material, can be used as the second ILD layer 16.

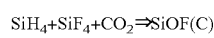
[Formula 1]

The dark current characteristics according to a kind of an insulating layer formed through chemical reaction represented as the above formula 1 will be listed as table 1 below.

TABLE 1

| Insulating Layer | Dark Current |
|---|---|
| SiOF(N, NH) | 1~20 code(s) |
| SiOF(C) | 15~100 codes |

Referring to Table 1, the insulating layer containing N and NH represents dark current of 1 to 20 codes, but the insulating layer containing C represents dark current of 15 to 100 codes. Thus, it is understood that the insulating layer containing N and NH shows excellently low dark current performance.

The process for forming the second ILD layer 16 containing N and NH is performed by mixing $N_2$, $SiH_4$, $N_2O$ and $SiF_4$ as illustrated in formula 1. Specifically, this process may be performed under a pressure ranging from approximately 0.1 Torr to approximately 10 Torr at a flow rate of $N_2$ ranging from approximately 300 sccm to approximately 3,000 sccm, a flow rate of $N_2O$ ranging from approximately 400 sccm to approximately 2,000 sccm, a flow rate of $SiH_4$ ranging from approximately 100 sccm to approximately 800 sccm, and a flow rate of $SiF_4$ ranging from approximately 300 sccm to approximately 1,000 sccm.

Although not shown, a silicon-rich oxide layer may be additionally formed to solve a limitation caused by nitrogen contained in the second ILD layer 16 during photoexposure for forming a trench for metal interconnection. The silicon-rich oxide layer may be formed to a thickness ranging from approximately 500 Å to approximately 2,000 Å.

The second ILD layer 16 is etched to form a first trench 17. To this end, although not shown, a photoresist layer is formed on the second ILD layer 16 and is exposed and developed to form a photoresist pattern exposing a predetermined region where the first trench 17 will be formed. The second ILD layer 16 and the diffusion barrier layer 15 are etched using the photoresist pattern as an etch mask thereby forming the first trench 17 exposing a surface of the contact plug 14. Thereafter, the photoresist pattern is removed using oxygen plasma.

A conductive material is formed to fill the first trench 17. Thereafter, the conductive material is planarized using the second insulating layer as a target, thereby forming a first metal interconnection 18. Herein, the first metal interconnection 18 is formed as a copper interconnection, and a copper diffusion barrier layer may be additionally formed before forming the copper interconnection.

Figure 1C:
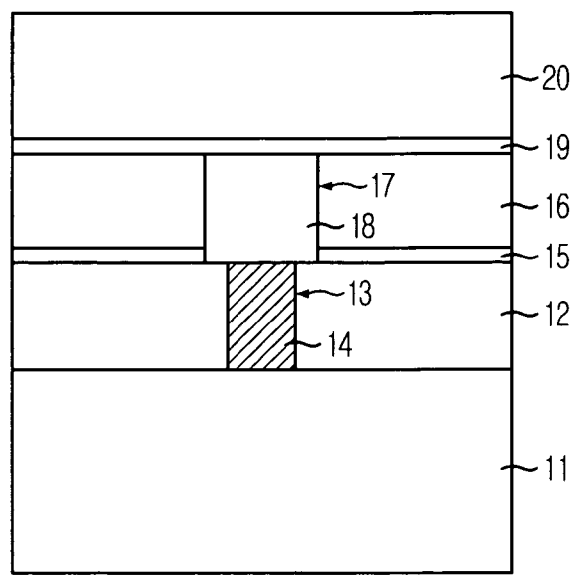

Referring to FIG. 1C, a second diffusion barrier layer 19 is formed on the second ILD layer 16 including the first metal interconnection 18. The second diffusion barrier layer 19 may be formed of the same material as the first diffusion barrier layer, e.g., SiC or SiN.

A third ILD layer 20 is formed on the second diffusion barrier layer 19. The third ILD layer 20 is also formed of the FSG containing nitrogen like the second ILD layer 16. To this end, the process of forming the third ILD layer 20 is performed by mixing $N_2$, $SiH_4$, $N_2O$ and $SiF_4$. Specifically, this process may be performed under a pressure ranging from approximately 0.1 Torr to approximately 10 Torr at a flow rate of $N_2$ ranging from approximately 300 sccm to approximately 3,000 sccm, a flow rate of $N_2O$ ranging from approximately 400 sccm to approximately 2,000 sccm, a flow rate of $SiH_4$ ranging from approximately 100 sccm to approximately 800 sccm, and a flow rate of $SiF_4$ ranging from approximately 300 sccm to approximately 1,000 sccm.

Figure 1D:
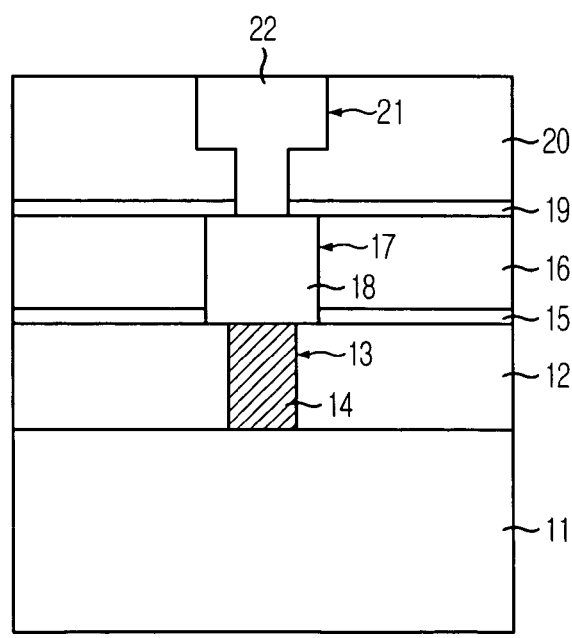

Referring to FIG. 1D, the third ILD layer is patterned using a dual damascene process to form a second trench 21. A conductive material is formed to fill the second trench. The conductive material is planarized using the third ILD layer as a target to thereby form a via and a second metal interconnection 22. The second metal interconnection is formed as a copper interconnection, and a copper diffusion barrier layer may be additionally formed before forming the cooper interconnection.

In accordance with the present invention, the diffusion barrier layer is formed of SiC or SiN after forming the contact plug, and thereafter the annealing process is performed. Thus, it is possible to secure thermal stability of a metal interconnection and also improve dark current characteristic by forming the FSG layer containing nitrogen. This makes it possible to improve reliability of the metal interconnection and device reliability.

While the present invention has been described with respect to the specific embodiments, it will be apparent to those skilled in the art that various changes and modifications may be made without departing from the spirit and scope of the invention as defined in the following claims.

What is claimed is:

1. A method for forming a metal interconnection in an image sensor, the method comprising:
   forming a first interlayer dielectric (ILD) layer having substantially and lower surfaces and a contact plug that extends from the upper surface to the lower surface over a substrate;
   forming a diffusion barrier layer over the first ILD layer;
   performing a forming gas annealing after forming the diffusion barrier layer;
   forming a second ILD layer over the diffusion barrier layer;
   etching through the second ILD layer and the diffusion barrier layer to form a trench;
   filling the trench with a conductive material which is electrically connected to the contact plug; and
   planarizing the conductive layer and an upper surface of the conductive material.

2. The method of claim 1, wherein the diffusion barrier layer includes one of SiC and SiN.

3. The method of claim 1, further comprising, before forming the metal interconnection, forming another diffusion barrier layer over the trench, wherein the other diffusion barrier layer includes a metal-based material.

4. The method of claim 1, wherein the forming gas annealing is performed in a mixture gas ambient of $H_2$ and $N_2$ under a condition that a ratio of $H_2/N_2$ is in the range of approximately 3% to approximately 30%.

5. The method of claim 4, wherein the forming gas annealing is performed at a temperature ranging from approximately 400° C. to approximately 600° C. for approximately 10 minutes to approximately 3 hours.

6. The method of claim 1, wherein the second ILD layer has a multi-layered structure.

7. The method of claim 6, wherein the second ILD layer includes fluorinated silicate glass (FSG) containing nitrogen.

8. The method of claim 7, wherein the FSG layer includes one of $N_2$ and $N_2O$.

9. The method of claim 8, wherein the FSG layer is formed by flowing a mixture gas at a flow rate of $N_2$ ranging from approximately 300 sccm to approximately 3,000 sccm, a flow rate of $N_2O$ ranging from approximately 400 sccm to approximately 2,000 sccm, a flow rate of $SiH_4$ ranging from approximately 100 sccm to approximately 800 sccm, and a flow rate of $SiF_4$ ranging from approximately 300 sccm to approximately 1,000 sccm.

10. The method of claim 9, wherein the FSG layer is formed under a pressure ranging from approximately 0.1 Torr to approximately 10 Torr.

11. The method of claim 1, further comprising forming a silicon-rich oxide layer over the second ILD layer.

12. The method of claim 11, wherein the silicon-rich oxide layer is formed to a thickness ranging from approximately 500 Å to approximately 2,000 Å.

13. The method of claim 12, wherein the contact plug includes tungsten with a Ti/TiN bilayer stacked.

14. The method of claim 1, wherein the trench is formed using a dual damascene process.

15. The method of claim 14, wherein the metal interconnection includes a copper-based interconnection.

* * * * *

UNITED STATES PATENT AND TRADEMARK OFFICE
CERTIFICATE OF CORRECTION

PATENT NO.        : 7,678,688 B2
APPLICATION NO.   : 11/641788
DATED             : March 16, 2010
INVENTOR(S)       : Kyeong-Keun Choi Page 1 of 1

It is certified that error appears in the above-identified patent and that said Letters Patent is hereby corrected as shown below:

In Claim 1, at column 4, line 27, insert --planar upper-- after "stantially"

Signed and Sealed this

Ninth Day of November, 2010

David J. Kappos
*Director of the United States Patent and Trademark Office*